United States Patent
Celestinos Arroyo

(10) Patent No.: US 10,469,046 B2
(45) Date of Patent: Nov. 5, 2019

(54) AUTO-EQUALIZATION, IN-ROOM LOW-FREQUENCY SOUND POWER OPTIMIZATION

(71) Applicant: Samsung Electronics Co., Ltd., Suwon-si, Gyeonggi-do (KR)

(72) Inventor: Adrian Celestinos Arroyo, Hollywood, CA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/806,991

(22) Filed: Nov. 8, 2017

(65) Prior Publication Data
US 2018/0262175 A1  Sep. 13, 2018

Related U.S. Application Data

(60) Provisional application No. 62/470,049, filed on Mar. 10, 2017.

(51) Int. Cl.
| | |
|---|---|
| *H03G 3/32* | (2006.01) |
| *H04R 29/00* | (2006.01) |
| *H03G 5/16* | (2006.01) |
| *H04R 3/00* | (2006.01) |
| *H04R 3/04* | (2006.01) |

(52) U.S. Cl.
CPC .............. *H03G 3/32* (2013.01); *H03G 5/165* (2013.01); *H04R 3/002* (2013.01); *H04R 3/04* (2013.01); *H04R 29/001* (2013.01)

(58) Field of Classification Search
USPC ... 381/56, 57, 58, 59, 71.8, 95, 96, 98, 103, 381/150, 300, 386
See application file for complete search history.

(56) References Cited

U.S. PATENT DOCUMENTS

| | | | |
|---|---|---|---|
| 4,823,391 | A | 4/1989 | Schwartz |
| 5,666,427 | A | 9/1997 | Kim et al. |
| 5,680,450 | A | 10/1997 | Dent et al. |

(Continued)

FOREIGN PATENT DOCUMENTS

| | | | | |
|---|---|---|---|---|
| JP | 7114392 A | | 3/1992 | |
| WO | WO-8400274 | * | 6/1983 | ............... H04R 3/00 |

(Continued)

OTHER PUBLICATIONS

Kleiner, M. et al., "Acoustics of Small Rooms," Book, Apr. 2014, pp. 64-65, 1st Ed., CRC Press, United States.
Small, R.H. et al., "Closed-Box Loudspeaker Systems Part I: Analysis," Book, Dec. 1972, pp. 285-303, vol. 20, J. Audio Eng. Soc., United States.

(Continued)

*Primary Examiner* — Yosef K Laekemariam
(74) *Attorney, Agent, or Firm* — Sherman IP LLP; Kenneth L. Sherman; Hemavathy Perumal

(57) ABSTRACT

One embodiment provides a device comprising a speaker driver, a microphone configured to obtain a measurement of a near-field sound pressure of the speaker driver, and a controller. The controller is configured to determine a velocity of a diaphragm of the speaker driver, and automatically calibrate sound power levels of audio reproduced by the speaker driver based on the velocity and the measurement of the near-field sound pressure to automatically adjust the sound power levels to an acoustic environment of the device.

20 Claims, 13 Drawing Sheets

(56) References Cited

U.S. PATENT DOCUMENTS

| | | | |
|---|---|---|---|
| 6,731,760 B2* | 5/2004 | Pedersen | H04R 3/04 |
| | | | 381/59 |
| 6,766,025 B1 | 7/2004 | Levy et al. | |
| 2007/0256888 A1 | 11/2007 | Plummer | |
| 2008/0008329 A1 | 1/2008 | Pedersen | |
| 2009/0028371 A1 | 1/2009 | Bailey | |
| 2010/0272270 A1 | 10/2010 | Chaikin et al. | |
| 2011/0243362 A1 | 10/2011 | Chick et al. | |
| 2012/0014529 A1 | 1/2012 | Yamkovoy et al. | |
| 2012/0121098 A1 | 5/2012 | Gautama | |
| 2012/0195447 A1 | 8/2012 | Hiruma et al. | |
| 2015/0215699 A1 | 7/2015 | Carlsson et al. | |
| 2016/0309276 A1 | 10/2016 | Ridihalgh et al. | |
| 2017/0141743 A1* | 5/2017 | Berkhout | G01R 31/2825 |

FOREIGN PATENT DOCUMENTS

| | | | | |
|---|---|---|---|---|
| WO | 1984000274 A1 | | 1/1984 | |
| WO | WO 84/00274 | * | 1/1984 | ............... H04R 3/00 |
| WO | WO 8400274 | * | 1/1984 | ............... H04R 3/00 |
| WO | 2012003894 A1 | | 1/2012 | |
| WO | 2015142873 A1 | | 3/2015 | |

OTHER PUBLICATIONS

Pintelon, R. et al., "System Identification: A Frequency Domain Approach," Book, Mar. 2012, pp. 119-150, 2nd Ed., Wiley-IEEE Press, United States.

International Search Report and Written Opinion dated Jun. 20, 2018 for International Application PCT/KR2018/002608 from Korean Intellectual Property Office, pp. 1-9, Republic of Korea.

* cited by examiner

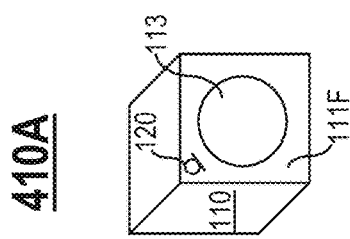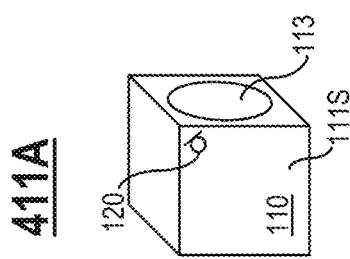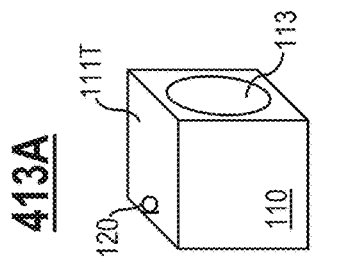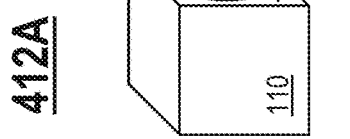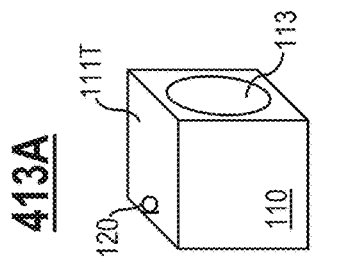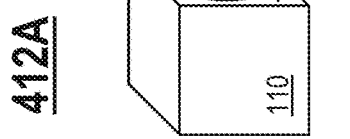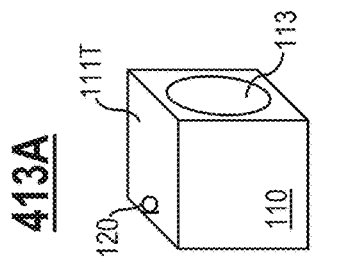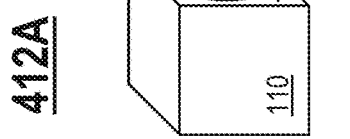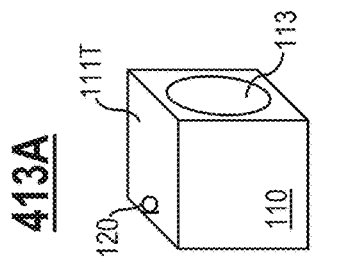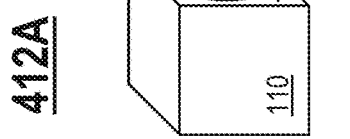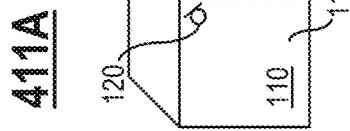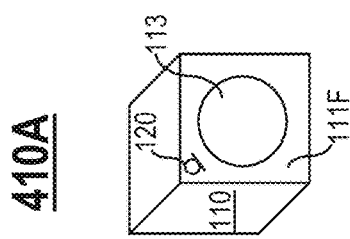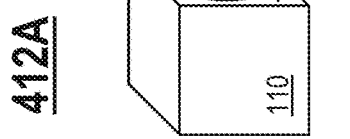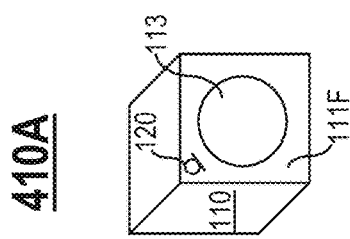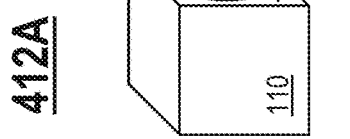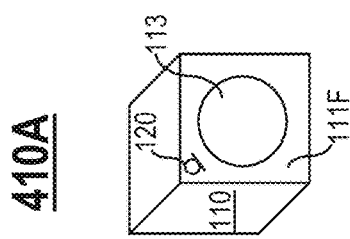

450
460
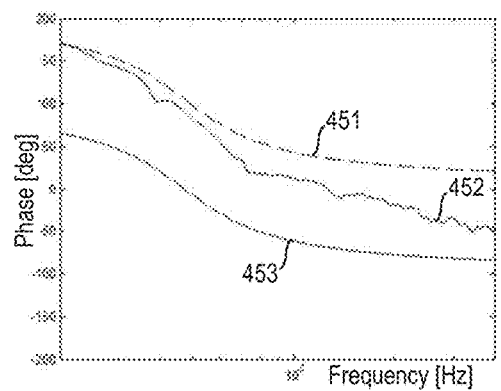
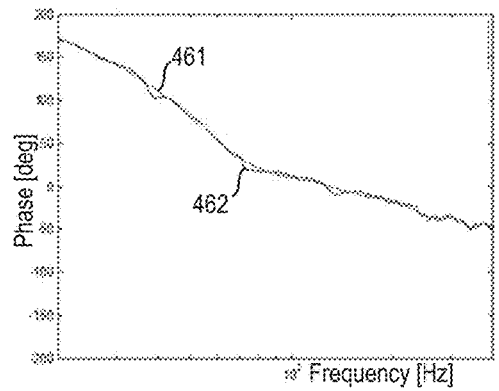
FIG. 8
FIG. 9

470
480
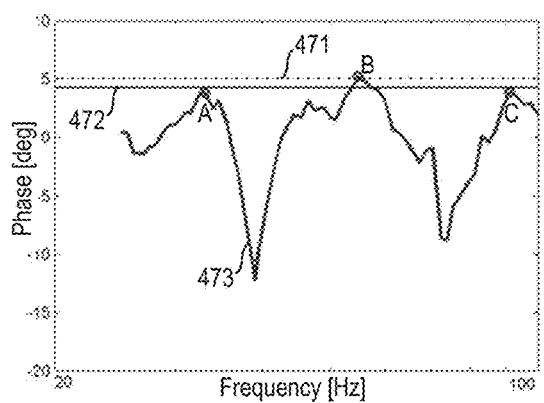
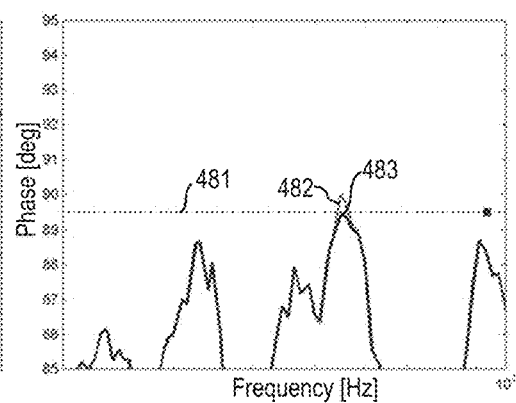
FIG. 10
FIG. 11

900

Obtaining a measurement of a near-field pressure of a speaker driver using a microphone — 901

↓

Determining a velocity of a diaphragm of the speaker driver — 902

↓

Automatically calibrating sound power levels of audio reproduced by the speaker driver based on the velocity and the measurement of the near-field pressure to automatically adjust the sound power levels to an acoustic environment of the speaker driver — 903

FIG. 17

AUTO-EQUALIZATION, IN-ROOM LOW-FREQUENCY SOUND POWER OPTIMIZATION

CROSS-REFERENCE TO RELATED APPLICATIONS

The present application claims priority to U.S. Provisional Patent Application No. 62/470,049, filed on Mar. 10, 2017, which is hereby incorporated by reference in its entirety.

COPYRIGHT DISCLAIMER

A portion of the disclosure of this patent document may contain material that is subject to copyright protection. The copyright owner has no objection to the facsimile reproduction by anyone of the patent document or the patent disclosure as it appears in the patent and trademark office patent file or records, but otherwise reserves all copyright rights whatsoever.

TECHNICAL FIELD

One or more embodiments relate generally to loudspeakers, and in particular, a sound power optimization system.

BACKGROUND

A loudspeaker produces sound when connected to an integrated amplifier, a television (TV) set, a radio, a music player, an electronic sound producing device (e.g., a smartphone), a video player, etc.

SUMMARY

One embodiment provides a device comprising a speaker driver, a microphone configured to obtain a measurement of a near-field sound pressure of the speaker driver, and a controller. The controller is configured to determine a velocity of a diaphragm of the speaker driver, and automatically calibrate sound power levels of audio reproduced by the speaker driver based on the velocity and the measurement of the near-field sound pressure to automatically adjust the sound power levels to an acoustic environment of the device.

These and other features, aspects and advantages of the one or more embodiments will become understood with reference to the following description, appended claims and accompanying figures.

BRIEF DESCRIPTION OF THE DRAWINGS

FIG. 3A illustrates a first example microphone position for a microphone, in accordance with an embodiment;

FIG. 3B illustrates a second example microphone position for a microphone, in accordance with an embodiment;

FIG. 3C illustrates a third example microphone position for a microphone, in accordance with an embodiment;

FIG. 3D illustrates a fourth example microphone position for a microphone, in accordance with an embodiment;

FIG. 3E illustrates a fifth example microphone position for a microphone, in accordance with an embodiment;

FIG. 3F illustrates a sixth example microphone position for a microphone, in accordance with an embodiment;

FIG. 3G illustrates a seventh example microphone position for a microphone, in accordance with an embodiment;

FIG. 3H illustrates an eighth example microphone position for a microphone, in accordance with an embodiment;

FIG. 8 is an example graph illustrating alignment of a phase of velocity of a diaphragm of a speaker driver with a phase of near-field sound pressure at about 20 Hertz (Hz), in accordance with an embodiment;

FIG. 9 is an example graph illustrating fitting of a phase curve for near-field sound pressure, in accordance with an embodiment;

FIG. 10 is an example graph illustrating a phase curve for a product term over the frequency domain, in accordance with an embodiment;

FIG. 11 is an example graph illustrating a phase curve for a product term over the frequency domain, in accordance with an embodiment;

FIG. 17 is an example flowchart of a process for sound power optimization, in accordance with an embodiment.

DETAILED DESCRIPTION

Figure 1:
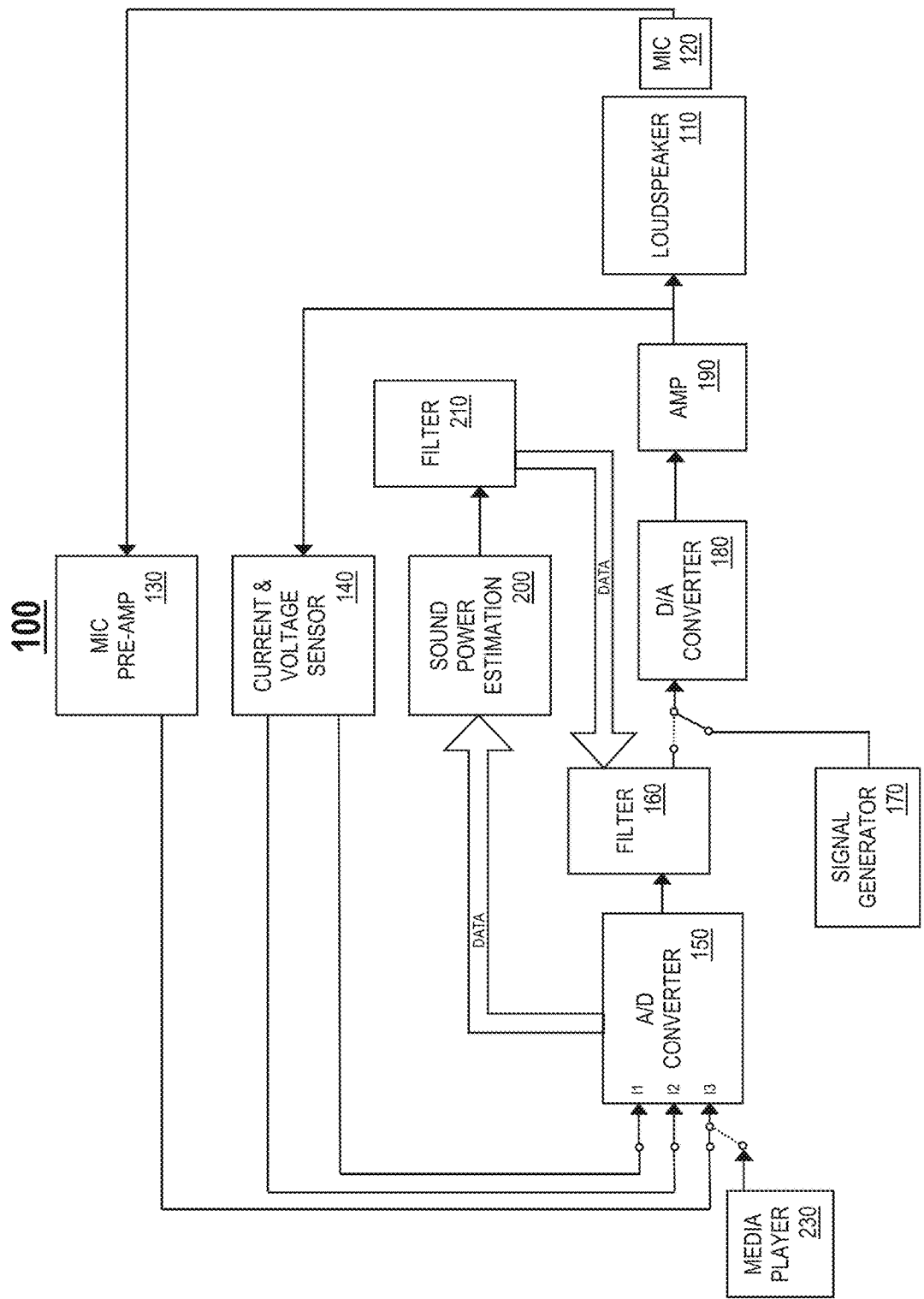
FIG. 1 illustrates an example sound power optimization system, in accordance with an embodiment.

The following description is made for the purpose of illustrating the general principles of one or more embodiments and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

One or more embodiments relate generally to loudspeakers, and in particular, a sound power optimization system. One embodiment provides a device comprising a speaker driver, a microphone configured to obtain a measurement of a near-field sound pressure of the speaker driver, and a controller. The controller is configured to determine a velocity of a diaphragm of the speaker driver, and automatically calibrate sound power levels of audio reproduced by the speaker driver based on the velocity and the measurement of the near-field sound pressure to automatically adjust the sound power levels to an acoustic environment of the device.

Typically, a number of issues arise when a loudspeaker device is positioned/placed in a room. For example, at low frequencies where sound wavelengths are similar to physical dimensions of the room, total sound power output of the loudspeaker device may be affected by resonances in the room, resulting in peaks and valleys that deteriorate spectral uniformity reproduced by the loudspeaker device. If no steps are takes to remedy the effects of the resonances, bass reproduced by the loudspeaker device may be perceived to be weak in some regions in the frequency domain and overpowering in other regions in the frequency domain where the resonances are excited, depending on a position/location of the loudspeaker device in the room.

One embodiment provides a system and method for in-room sound field control. The system and method automatically enhance total sound power output of a loudspeaker device in a room based on a position/location of the loudspeaker device in the room.

One embodiment provides a system comprising a loudspeaker device, at least one microphone for measuring near-field sound pressure of the loudspeaker device, and at least one sensor device for sensing current of the loudspeaker device. Based on the current sensed, the system determines a velocity of a diaphragm of a speaker driver (e.g., a tweeter, a woofer, etc.) of the loudspeaker device. Based on the velocity determined and the near-field sound pressure measured, the system determines total sound power output radiated from the loudspeaker device and adjusts the total sound power output based on a pre-determined target sound power output. In one example implementation, the total sound power output is improved or optimized to the pre-determined target.

In one example implementation, the system utilizes only one microphone positioned in front of the diaphragm of the speaker driver and only one sensor device, thereby removing the need for a mechanical moving device. The system provides smooth bass response in a room without needing to obtain measurements at different listening positions in the room.

In one example implementation, the system automatically adjusts total sound power output radiated from the loudspeaker device based on acoustic conditions of the room (e.g., physical dimensions such as ceiling height, moving the loudspeaker device 110 from one position to another position in the room, changes resulting from one or more physical structures in the room, such as opening all doors, closing a room divider, opening a car window, air-conditioning turned on, etc.) and a position/location of the loudspeaker device in the room, thereby improving overall listening experience by increasing clarity and spectral uniformity of sound/audio reproduced by the loudspeaker device.

The system only requires one measurement (i.e., the near-field sound pressure) to automatically equalize total sound power output radiated from the loudspeaker device in the room.

FIG. 1 illustrates an example sound power optimization system 100, in accordance with an embodiment. The sound power optimization system 100 comprises a loudspeaker device 110 positioned/located in a room. In one embodiment, the loudspeaker device 110 is a closed-box loudspeaker comprising a speaker housing 111 (FIG. 2) including at least one speaker driver 112 (FIG. 2) for reproducing sound, such as a woofer, etc. In one embodiment, at least one speaker driver 112 is a forward-facing speaker driver. In another embodiment, at least one speaker driver 112 is an upward-facing driver. In yet another embodiment, at least one speaker driver 112 is a downward-facing driver.

The system 100 further comprises at least one microphone 120 for capturing audio signals. As described in detail later herein, the audio signals captured are used to measure near-field sound pressure of the loudspeaker device 110. The microphone 120 may be positioned/placed in different positions relative to a speaker driver 112. In one embodiment, the system 100 comprises only one microphone 120 positioned/placed as close as possible to a diaphragm 113 (FIG. 2) of a speaker driver 112. In one example implementation, the microphone 120 is attached to the diaphragm 113 of the speaker driver 112. In another example implementation, the microphone 120 is positioned/placed substantially about 1 inch in front of the diaphragm 113 of the speaker driver 112.

In one embodiment, the system 100 further comprises at least one microphone pre-amplifier 130 connected to at least one microphone 120 for amplifying audio signals captured by the microphone 120.

The system 100 further comprises a current and voltage sensor device 140 connected to the loudspeaker device 110 for sensing current and voltage of the loudspeaker device 110. In one embodiment, the sensor device 140 is connected to terminals of the speaker driver 112.

The system 100 further comprises an analog-to-digital (A/D) converter 150 comprising multiple input channels. In one embodiment, the A/D converter 150 is configured to: (1) receive a first input from the sensor device 140 via a first input channel ("I1"), (2) receive a second input from the sensor device 140 via a second input channel ("I2"), and (3) receive a third input via a third input channel ("I3"). The A/D converter 150 converts each analog input received via an input channel to digital signals (e.g., analog audio from the media player 230).

In one embodiment, the first input comprises information indicative of a current, sensed by the sensor device 140, of the loudspeaker device 110. In one embodiment, the second input comprises information indicative of a voltage, sensed by the sensor device 140, of the loudspeaker device 110.

In one embodiment, the system 100 switches between the microphone pre-amplifier 130 and a media player 230 as a source for the third input. If the A/D converter 150 receives the third input from the microphone pre-amplifier 130, the third input comprises amplified audio signals captured by a microphone 120 and amplified by the microphone pre-amplifier 130. If the A/D converter 150 receives the third input from the media player 230, the third input comprises audio for reproduction by the loudspeaker device 110.

In one embodiment, the media player 230 comprises, but is not limited to, a mobile electronic device (e.g., a smartphone, a laptop, a tablet, etc.), a content playback device (e.g., a television, a radio, a music player such as a CD player, a video player such as a DVD player, a turntable, etc.), an audio receiver, etc.

The system 100 further comprises a sound power estimation unit 200. In one embodiment, the sound power estimation unit 200 operates as a controller configured to initiate and perform automatic calibration of sound power levels of audio reproduced by the speaker driver 112 based on velocity of the diaphragm 113 of the speaker driver 112 and measurement of the near-field sound pressure to automatically adjust the sound power levels to an acoustic environment of the loudspeaker device 110. In one embodiment, the automatic calibration performed by the sound power estimation unit 200 comprises estimating in-room total sound power output radiated from the loudspeaker device 110 based on digital signals from the A/D converter 150. For expository purposes, the terms "sound power estimation unit" and "controller" are used interchangeably in this specification.

In one embodiment, in response to the sound power estimation unit 200 initiating and performing automatic calibration of sound power levels of audio reproduced by the speaker driver 112, the system 100 switches to the microphone pre-amplifier 130 as a source for the third input (i.e., the A/D converter 150 receives the third input from the microphone pre-amplifier 130 during the calibration). After the calibration, the system 100 automatically switches back to the media player 230 as a source for the third input (i.e., the A/D converter 150 receives the third input from the media player 230 after the calibration).

The system 100 further comprises a digital filter 210. In one embodiment, the digital filter 210 is a memory infinite impulse response (IIR) filter or a minimum phase finite impulse response filter (FIR). The digital filter 210 is configured to: (1) receive, from the sound power estimation unit 200, an estimated in-room total sound power output radiated from the loudspeaker device 110, and (2) adjust the estimated in-room total sound power output based on a pre-determined target sound power output. In one embodiment, the digital filter 210 improves or optimizes the estimated in-room total sound power output to the pre-determined target.

The system 100 further comprises an auto-equalization (auto-EQ) filter 160 configured to: (1) receive, from the digital filter 210, estimated in-room total sound power output, and (2) receive, from the A/D converter 150, digital signals. As described in detail later herein, the auto-EQ filter 160 is configured to automatically equalize the estimated in-room total sound power output.

The system 100 further comprises a digital-to-analog (D/A) converter 180 configured to: (1) receive, from the auto-EQ filter 160, equalized in-room total sound power output, and (2) convert the equalized in-room total sound power output to analog signals.

The system 100 further comprises an amplifier 190 configured to: (1) receive analog signals from the D/A converter 180, (2) amplify the analog signals, and (3) forward the amplified analog signals to the loudspeaker device 110 for reproduction by at least one speaker driver 112. The amplified signals may also be forwarded to the sensor device 140 to create a dynamic feedback loop.

In one embodiment, the system 100 further comprises a signal generator 170 configured to acquire actual in-room total sound power output for the loudspeaker device 100 in response to the sound power estimation unit 200 initiating calibration. In one embodiment, the actual in-room total sound power output is based on measurements from multiple microphones placed at different locations of the room.

In one embodiment, the system 100 may be integrated in, but not limited to, one or more of the following: a smart device (e.g., smart TV), a subwoofer, wireless and portable speakers, car speakers, etc.

Figure 2:
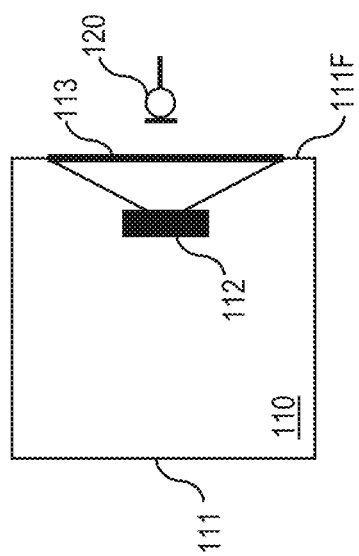
FIG. 2 is a cross section of an example loudspeaker device, in accordance with an embodiment.

FIG. 2 is a cross section of an example loudspeaker device 110, in accordance with an embodiment. In one embodiment, the loudspeaker device 110 is a closed-box loudspeaker comprising a speaker housing 111 including a speaker driver 112 (e.g., a woofer, etc.) for reproducing sound. As shown in FIG. 2, in one embodiment, the speaker driver 112 is a forward-facing speaker driver with a diaphragm 113 disposed along a front face 111F of the speaker housing 111.

In one embodiment, as shown in FIG. 2, the system 100 utilizes only one microphone 120 positioned as close as possible to the diaphragm 113, thereby removing the need for a mechanical moving device. In one example implementation, the microphone 120 is positioned/placed substantially about 1 inch in front of the diaphragm 113.

Let $W_{source}$ denote a sound power output radiated from a compact sound source (e.g., a speaker driver 112). The sound power output $W_{source}$ may be determined in accordance with equations (1)-(2) provided below:

$$W_{source} = R_{e\text{-}source}\{Z_{rad}\}U^2 \quad (1), \text{ and}$$

$$Z_{rad}(j\omega) = (p_{source}(j\omega))/(U(j\omega)) \quad (2),$$

wherein $Z_{rad}$ is a complex radiation impedance for the compact sound source in the frequency domain, $p_{source}$ is a complex pressure for the compact sound source, U is a complex volume velocity for the compact sound source, $R_{e\text{-}source}$ is a direct current resistance for the compact sound source, and the product term $j\omega$ is a complex variable in which j is an imaginary unit/value, $\omega$ is an angular frequency for the compact sound source, $\omega=2\pi f$, and f is a discrete frequency in Hertz (Hz) units for the compact sound source.

In one embodiment, the system 100 is configured to estimate a in-room total sound power output W radiated from the closed-box loudspeaker device 110 (FIG. 2) in accordance with equation (3) provided below:

$$W = \tfrac{1}{2}\text{real}\{pu^*\} \quad (3),$$

wherein p is a near-field sound pressure in front of the diaphragm 113 (FIG. 2) of the speaker driver 112 (FIG. 2) of the loudspeaker device 110, u* is the complex conjugate of a velocity u of the diaphragm 113, and real is the real part of the product term pu*.

In one embodiment, the system 100 is configured to perform the following steps: (1) obtain a measurement of the near-field sound pressure p and an impedance Z of the speaker driver 112, (2) determine a velocity u of the diaphragm 113, (3) apply phase correction of the velocity u to obtain the complex conjugate u*, and (4) estimate the in-room total sound power output W based in part on the near-field sound pressure p and the complex conjugate u* (i.e., see equation (3) provided above).

In one embodiment, the system 100 obtains a measurement of the near-field sound pressure p at discrete frequencies (e.g., frequencies within the 20 Hz to 400 Hz frequency range) in the frequency domain by applying a multisine algorithm for frequency response estimation based on audio signals captured by the microphone 120. Referring back to FIG. 2, in one embodiment, the microphone 120 is attached as close as possible to the diaphragm 113 of the speaker driver 112 (e.g., approximately 1 inch in front of the diaphragm 113). In other embodiments, the microphone 120 may be positioned/placed in different positions relative to the speaker driver 112.

For example, FIGS. 3A-3H illustrate different microphone positions. Specifically, FIG. 3A illustrates a first example microphone position 410A for the microphone 120, wherein the microphone 120 is attached to the front face 111F of the speaker housing 111 and positioned substantially about a corner end of the front face 111F and above the diaphragm 113, in accordance with an embodiment.

FIG. 3B illustrates a second example microphone position 411A for the microphone 120, wherein the microphone 120 is attached to a sidewall 111S of the speaker housing 111 and positioned substantially about a corner end of a proximate edge of the sidewall 111S, in accordance with an embodiment.

FIG. 3C illustrates a third example microphone position 412A for the microphone 120, wherein the microphone 120 is attached to the front face 111F of the speaker housing 111 and positioned to a side of the diaphragm 113, in accordance with an embodiment.

FIG. 3D illustrates a fourth example microphone position 413A for the microphone 120, wherein the microphone 120 is attached to a top face 111T of the speaker housing 111 and positioned substantially about a distal edge of the top face 111T, in accordance with an embodiment.

FIG. 3E illustrates a fifth example microphone position 414A for the microphone 120, wherein the microphone 120 is attached to the top face 111T of the speaker housing 111 and positioned substantially about a center of the top face 111T, in accordance with an embodiment.

FIG. 3F illustrates a sixth example microphone position 415A for the microphone 120, wherein the microphone 120 is attached to a sidewall 111S of the speaker housing 111 and positioned substantially about a center of a proximate edge of the sidewall 111S, in accordance with an embodiment.

FIG. 3G illustrates a seventh example microphone position 416A for the microphone 120, wherein the microphone 120 is attached to the top face 111T of the speaker housing 111 and positioned substantially about a center of a proximate edge of the top face 111F, in accordance with an embodiment.

FIG. 3H illustrates an eighth example microphone position 417A for the microphone 120, wherein the microphone 120 is attached to a center of the diaphragm 113, in accordance with an embodiment.

Figure 4:
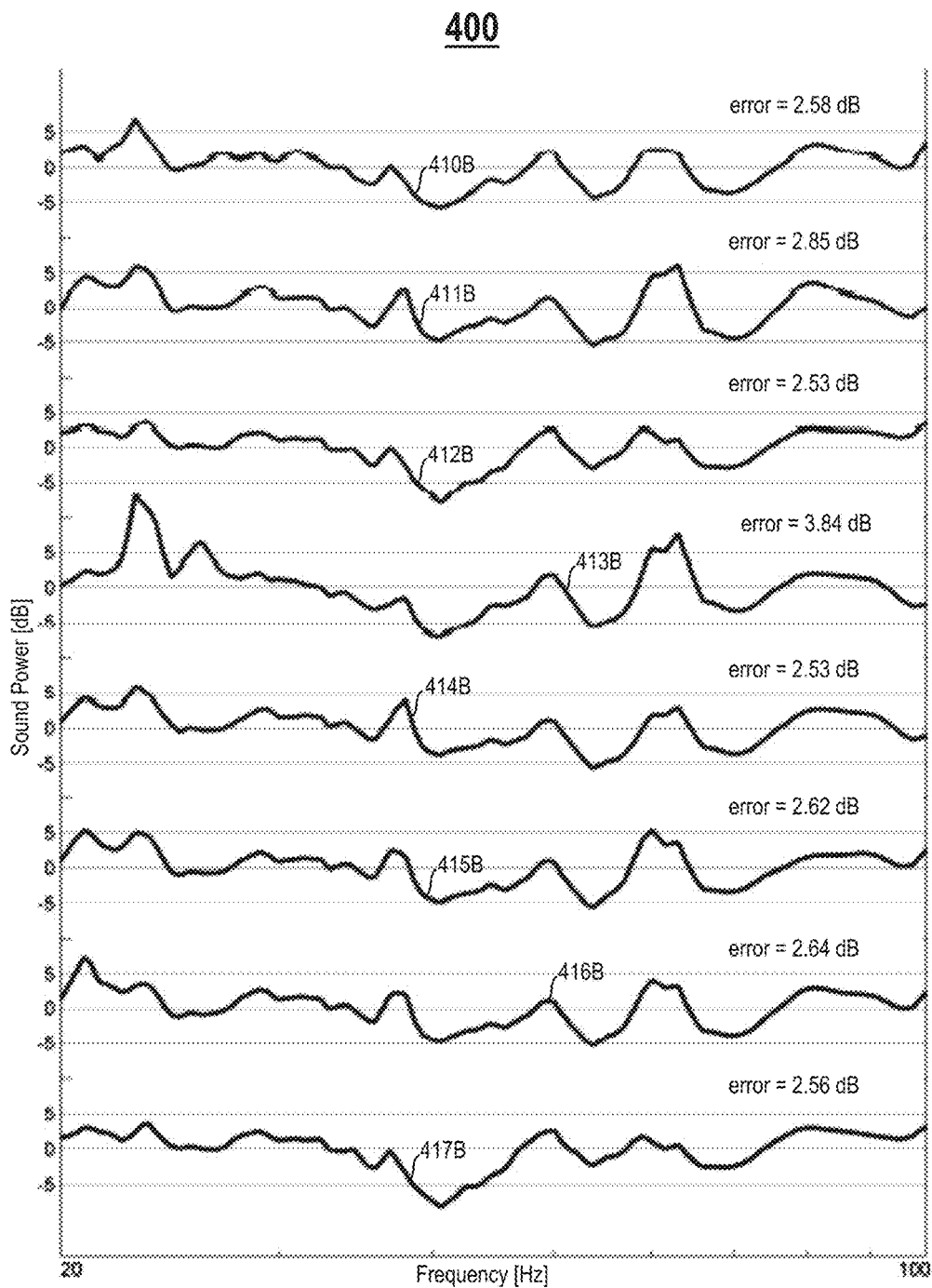
FIG. 4 is an example graph illustrating errors in estimated in-room total sound power output for different microphone positions, in accordance with one embodiment.

FIG. 4 is an example graph 400 illustrating errors in estimated in-room total sound power output W for different microphone positions, in accordance with one embodiment. A vertical axis of the graph 400 represents sound power levels expressed in decibel (dB) units. A horizontal axis of the graph 400 represents frequency values in the frequency domain expressed in Hertz (Hz) units. The graph 400 comprises each of the following curves: (1) a first curve 410B representing an error (e.g., average of 2.58 dB) between an estimated in-room total sound power output W for the first microphone position 410A (FIG. 3A) and an actual in-room total sound power output (e.g., measured from about nine microphones placed at different locations of the room), (2) a second curve 411B representing an error (e.g., average of 2.85 dB) between an estimated in-room total sound power output W for the second microphone position 411A (FIG. 3B) and the actual in-room total sound power output, (3) a third curve 412B representing an error (e.g., average of 2.53 dB) between an estimated in-room total sound power output W for the third microphone position 412A (FIG. 3C) and the actual in-room total sound power output, (4) a fourth curve 413B representing an error (e.g., average of 3.84 dB) between an estimated in-room total sound power output W for the fourth microphone position 413A (FIG. 3D) and the actual in-room total sound power output, (5) a fifth curve 414B representing an error (e.g., average of 2.53 dB) between an estimated in-room total sound power output W for the fifth microphone position 414A (FIG. 3E) and the actual in-room total sound power output, (6) a sixth curve 415B representing an error (e.g., average of 2.62 dB) between an estimated in-room total sound power output W for the sixth microphone position 415A (FIG. 3F) and the actual in-room total sound power output, (7) a seventh curve 416B representing an error (e.g., average of 2.64 dB) between an estimated in-room total sound power output W for the seventh microphone position 416A (FIG. 3G) and the actual in-room total sound power output, and (8) an eighth curve 417B representing an error (e.g., average of 2.56 dB) between an estimated in-room total sound power output W for the eighth microphone position 417A (FIG. 3H) and the actual in-room total sound power output.

As shown in FIG. 4, based on the errors illustrated, an optimal microphone position for the microphone 120 may be in front of the diaphragm 113 (e.g., microphone position 413A).

In one embodiment, the multisine algorithm for frequency response estimation utilizes repeated frames of multisines as an excitation signal and includes a dual channel fast Fourier transform (FFT) analysis. To avoid leakage during the FFT analysis, frequencies of the sines are all harmonics of an inverse of a frame duration. Phases are randomized to obtain a Gaussian amplitude distribution. Frame repetition allows averaging out noise that may be included in measurements of the near-field sound pressure p, and repetition of frames with different phase patterns allows averaging out nonlinear effects.

In one embodiment, the estimation of in-room total sound power output using the measurement of the near-field sound pressure p is performed at the sound power estimation unit 200.

In one embodiment, the system 100 determines the velocity u of the diaphragm 113 based on current I sensed/acquired by the sensor device 140 connected to the terminals of the speaker driver 112. In one embodiment, the system 100 computes the impedance Z of the speaker driver 112 in accordance with equation (4) provided below:

$$Z(j\omega)=(V(j\omega))/(I(j\omega)) \qquad (4),$$

wherein V is an input voltage to the terminals of the speaker driver 112. The system 110 computes the impedance Z at discrete frequencies (e.g., frequencies within the 20 Hz to 400 Hz frequency range) in the frequency domain based on the input voltage V and the sensed/acquired current I. In one embodiment, a high resolution in frequency is required across a low frequency range to obtain an accurate impedance Z.

Figure 5:
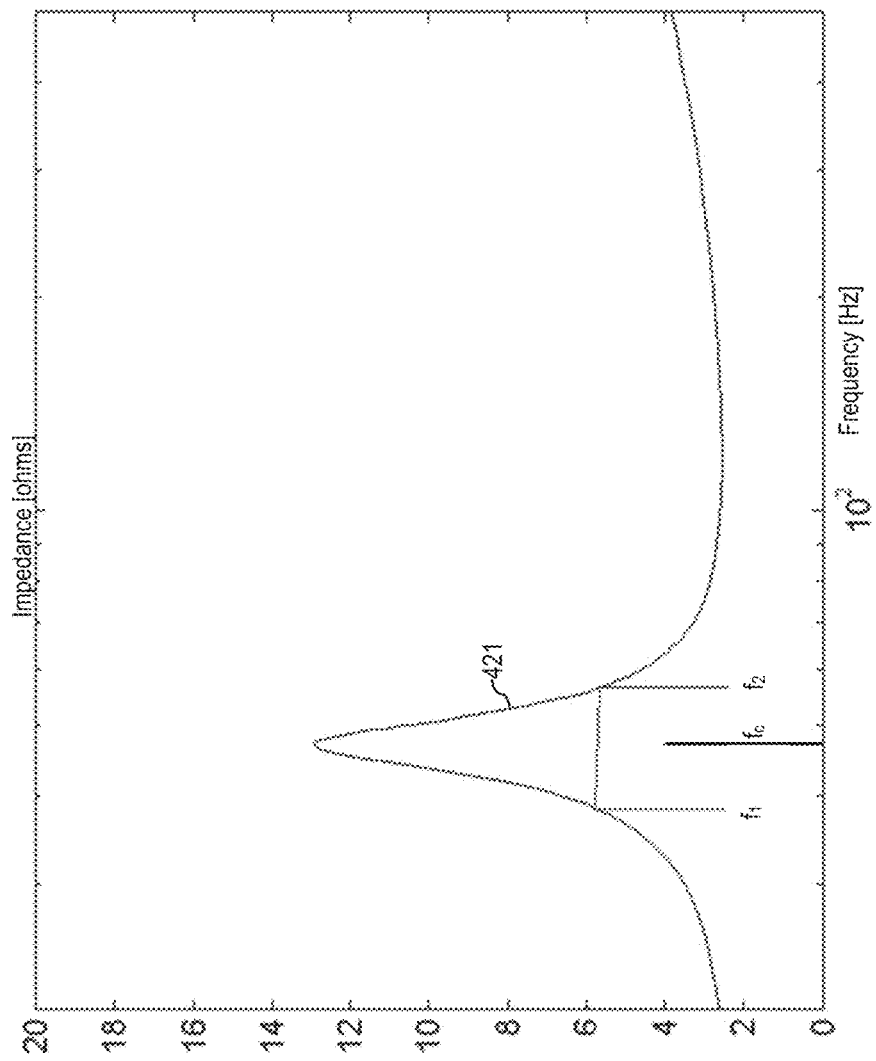
FIG. 5 is an example graph illustrating an impedance curve for an example closed-box loudspeaker device, in accordance with one embodiment.

FIG. 5 is an example graph 420 illustrating an impedance curve 421 for an example closed-box loudspeaker device 110, in accordance with one embodiment. In one example implementation, the loudspeaker device 110 comprises a 12-inch subwoofer. A vertical axis of the graph 420 represents impedance expressed in ohm units. A horizontal axis of the graph 420 represents frequency values in the frequency domain expressed in Hz units. With reference to FIG. 5, in one embodiment, the system 100 computes a resonant frequency $f_c$ for the loudspeaker device 110 based on a maximum value of the impedance curve 421. Let $f_1$ and $f_2$ generally denote points on the impedance curve 421, wherein $f_1$ and $f_2$ satisfy expressions (5) and (6) provided below:

$$f_1 < f_c \text{ where } R = R_e \sqrt{R_c} \qquad (5), \text{ and}$$

$$f_2 > f_c \text{ where } R = R_e \sqrt{R_c} \qquad (6),$$

wherein $R_c=R_{max}/R_e$, and $R_{max}$ is a maximum direct current resistance for the loudspeaker device 110.

In one embodiment, the system 100 computes a mechanical Q factor $Q_{mc}$, an electrical Q factor $Q_{ec}$, and a total Q factor $Q_{tc}$ for the loudspeaker device 110 in accordance with equations (7)-(9) provided below:

$$Q_{mc}=(f_c\sqrt{R_c})/(f_2-f_1) \qquad (7),$$

$$Q_{ec}=Q_{mc}/(R_c-1) \qquad (8), \text{ and}$$

$$Q_{tc}=(Q_{ec}Q_{mc})/(Q_{ec}+Q_{mc}) \qquad (9).$$

In one embodiment, a time constant $T_c$ of the system 100 is represented in accordance with equations (10)-(11) provided below:

$$T_c = \frac{1}{\omega_c}, \text{ and} \qquad (10)$$

$$\omega_c = 2\pi f_c. \qquad (11)$$

In one embodiment, a transfer function X(s) from voltage (i.e., the input voltage V to the terminals of the speaker driver 112) to displacement of the diaphragm 113 is represented in accordance with equation (12) provided below:

$$X(s) = \frac{1}{s^2 T_c^2 + \frac{sT_c}{Q_{tc}} + 1}, \qquad (12)$$

wherein s is a complex frequency variable represented in accordance with equation (13) provided below:

$$s=\sigma+j\omega_c \qquad (13),$$

wherein σ is a real value. The transfer function X(s) is proportional to a prototype low pass second-order filter function normalized to unity in a passband.

In one embodiment, the system 100 computes the velocity u of the diaphragm 113 in accordance with equation (14) provided below:

$$u=j\omega_c X(s) \qquad (14).$$

In one embodiment, the velocity u of the diaphragm 113 is computed at the sound power estimation unit 200.

In another embodiment, the velocity u of the diaphragm 113 may be obtained by other known methods such as, but not limited to, an accelerometer, a lap laser, etc.

In another embodiment, the sound power estimation unit 200 is configured to identify one or more parameters of the loudspeaker device 110 (e.g., the total Q factor $Q_{tc}$ and the resonant frequency $f_c$ for the loudspeaker device 110, or the impedance Z of the speaker driver 112) using system identification in the frequency domain or in the time domain based on measurements of current, voltage, and/or near-field sound pressure.

In another embodiment, the impedance Z of the speaker driver 112 may be obtained by time domain algorithms (e.g., Kalman filters, recursive least square etc.).

Figure 6:
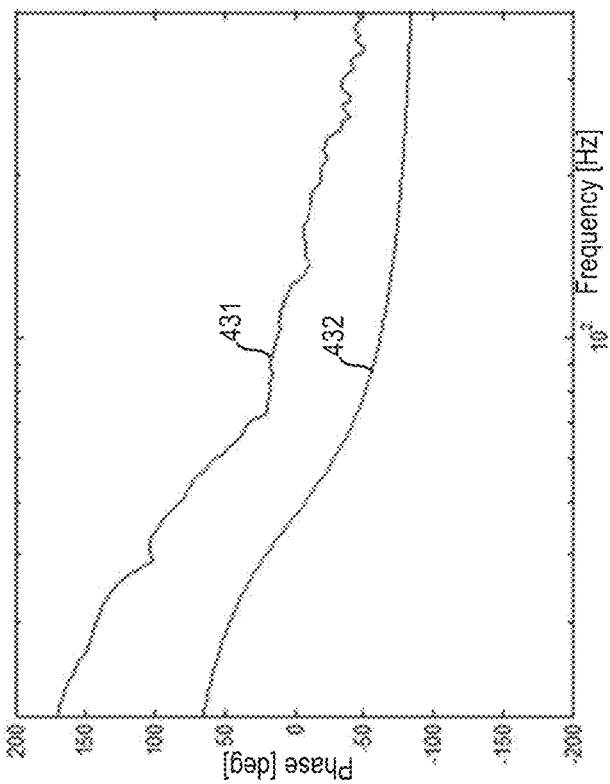
FIG. 6 is an example graph illustrating near-field sound pressure and velocity of a diaphragm of a speaker driver, in accordance with an embodiment.

FIG. 6 is an example graph 430 illustrating the near-field sound pressure p and the velocity u, in accordance with an embodiment. A vertical axis of the graph 430 represents phase angles expressed in degree units. A horizontal axis of the graph 430 represents frequency values in the frequency domain expressed in Hz units. The graph 430 comprises: (1) a first curve 431 representing a phase curve for the near-field sound pressure p over the frequency domain, and (2) a second curve 432 representing a phase curve for the velocity u over the frequency domain.

In one embodiment, the system 100 applies phase correction of the velocity u of the diaphragm 113 to have an accurate estimation of the in-room total sound power output W.

Figure 7:
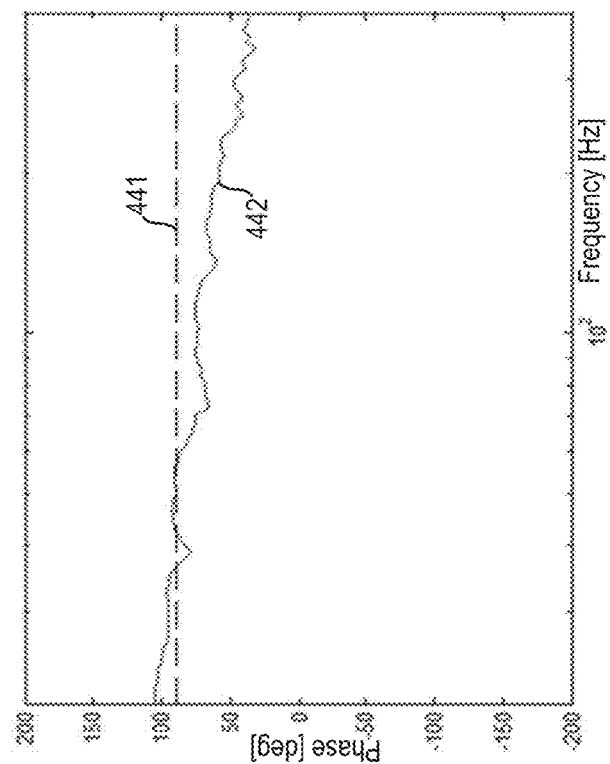
FIG. 7 is an example graph illustrating phase difference between near-field sound pressure and velocity of a diaphragm of a speaker driver, in accordance with an embodiment.

FIG. 7 is an example graph 440 illustrating phase difference between the near-field sound pressure p and the velocity u, in accordance with an embodiment. A vertical axis of the graph 440 represents phase angles expressed in degree units. A horizontal axis of the graph 440 represents frequency values in the frequency domain expressed in Hz units. The graph 440 comprises: (1) a first horizontal line 441 representing a phase angle at 90 degrees, and (2) a curve 442 representing phase difference between the near-field sound pressure p and the velocity u over the frequency domain.

As shown in FIG. 7, a phase mismatch may result due to propagation delay between the microphone 120 and the diaphragm 130. Typically, at low frequencies and at a small distance to a sound source, the near-field sound pressure p is 90 degrees ahead of the velocity u. Let kr<<1, wherein k is a wave number, and r is a distance to the sound source. As shown in FIG. 7, phase difference between the near-field sound pressure p and the velocity u may not be constant across frequencies, resulting in inaccurate sound power estimations.

To alleviate this issue, in one embodiment, the system 100 first aligns a phase of the velocity u with a phase of the near-field sound pressure p at about 20 Hz to obtain an adjusted/modified complex velocity $u_x$, as represented by equations (15)-(16) provided below:

$$x=\angle p(f_{20})-\angle u(f_{20}) \qquad (15), \text{ and}$$

$$u_x=|u|(\cos(\angle u+x)+j\sin(\angle u+x)) \qquad (16).$$

FIG. 8 is an example graph 450 illustrating alignment of a phase of the velocity u with a phase of the sound pressure at about 20 Hz, in accordance with an embodiment. A vertical axis of the graph 450 represents phase angles expressed in degree units. A horizontal axis of the graph 450 represents frequency values in the frequency domain expressed in Hz units. The graph 450 comprises: (1) a first curve 452 representing a phase curve for the near-field sound pressure p over the frequency domain, (2) a second curve 453 representing a phase curve for the velocity u over the frequency domain, and (3) a third curve 451 representing a phase curve for the adjusted/modified complex velocity $u_x$ over the frequency domain. The third curve 451 results from shifting the second curve 453 to align with the first curve 452 at about 20 Hz.

Next, the system 100 finds a general trend that fits a phase curve (e.g., curve 431 in FIG. 6) for the near-field sound pressure p. In one example implementation, this involves fitting of a polynomial using a least squares method. Specifically, the phase curve for the near-field sound pressure p at discrete frequencies is stored as $b_t(f)$ represented by equation (17) provided below:

$$b_1(f)=\angle p(f) \qquad (17),$$

wherein the phase curve is fitted to a polynomial with coefficients $b_1, b_2 \ldots b_n+1$ in accordance with equation (18) provided below:

$$b(f)=b_1 f^n+b_2 f^{n-1}+\ldots+b_n f+b_{n+1} \qquad (18).$$

In one embodiment, the coefficients are evaluated and a new phase curve y for the near-field sound pressure p is obtained by subtracting original phase angles of the adjusted/modified complex velocity $u_x$, in accordance with equations (19)-(20) provided below:

$$B = b_1 f^n + b_2 f^{n-1} + \ldots + b_n f + b_{n+1} \quad (19), \text{ and}$$

$$y = B - \sphericalangle u_x \quad (20).$$

In one embodiment, the system 100 applies phase correction to the adjusted/modified complex velocity $u_x$ in accordance with equation (21) provided below:

$$u_x = |u_x|(\cos(\sphericalangle u_x + y) + j \sin(\sphericalangle u_x + y)) \quad (21).$$

FIG. 9 is an example graph 460 illustrating fitting of a phase curve for the near-field sound pressure p, in accordance with an embodiment. A vertical axis of the graph 460 represents phase angles expressed in degree units. A horizontal axis of the graph 460 represents frequency values in the frequency domain expressed in Hz units. The graph 460 comprises: (1) a first curve 462 representing a phase curve for the near-field sound pressure p over the frequency domain, and (2) a second curve 461 representing a general trend that fits the first curve 462 (e.g., via fitting of a polynomial using a least squares method).

In one embodiment, based on a phase curve for the product term pu* (e.g., phase curve 473 in FIG. 10) and one or more prominent peaks $P_{k_i}$ (e.g., from 25 Hz to 100 Hz) included in the phase curve, the system 100 then computes a mean $p_{k_{mean}}$ of the peaks $P_{k_i}$ and a standard deviation $p_{k_{std}}$ of the peaks $P_{k_i}$ in accordance with equations (22)-(23) provided below:

$$p_{k_{mean}} = \frac{1}{n} \sum_{i=1}^{n} P_{k_i}, \text{ and} \quad (22)$$

$$p_{k_{std}} = \sqrt{\frac{1}{n} \sum_{i=1}^{n} (P_{k_i} - p_{k_{mean}})^2}. \quad (23)$$

In one embodiment, the system 100 searches/identifies for the most prominent peaks $P_{k_i}$ in accordance with equations (24)-(25) provided below:

$$\text{Peak Selection} = (\max(\sphericalangle pu^*) - \min(\sphericalangle pu^*))/8, \text{ and} \quad (24)$$

$$\text{Peak Threshold} = \frac{1}{n} \sum_{i=1}^{n} \sphericalangle (pu^*(f_i)), \quad (25)$$

wherein Peak Threshold is a threshold that the peaks identified must satisfy.

FIG. 10 is an example graph 470 illustrating a phase curve 473 for the product term pu* over the frequency domain, in accordance with an embodiment. A vertical axis of the graph 470 represents phase angles expressed in degree units. A horizontal axis of the graph 470 represents frequency values in the frequency domain expressed in Hz units. As shown in FIG. 10, the phase curve 473 includes one or more prominent peaks $P_{k_i}$ (e.g., at about the 25 Hz to 100 Hz frequency range), such as a first peak A, a second peak B, and a prominent peak C. The graph 470 further comprises: (1) a first horizontal line 471 representing the standard deviation $p_{k_{std}}$ of the peaks $P_{k_i}$, and (2) a second horizontal line 472 representing the mean $p_{k_{mean}}$ of the peaks $P_{k_i}$.

In one embodiment, the system 100 then moves/shifts a phase curve for the adjusted/modified complex velocity $u_x$ by about φ degrees, as represented in accordance with equations (26)-(27) provided below:

$$\varphi = -1 * [K - (p_{k_{mean}} + p_{k_{std}})] \quad (26), \text{ and}$$

$$u_x = |u_x|(\cos(\sphericalangle u_x + \varphi) + j \sin(\sphericalangle u_x + \varphi)) \quad (27),$$

wherein K is a constant that can be adjusted as close as possible to 90 degrees, such that the near-field sound pressure p is ahead of the adjusted/modified complex velocity $u_x$ by about 90 degrees when the product term pu* is computed.

If a phase angle of the product term pu* is exactly 90 degrees, the estimated in-room total sound power output W would be close to zero as there is no sound power at all. To prevent a phase angle of the product term pu* from being exactly 90 degrees, the system 100 applies a function that observes the phase angle and limits it if it exceeds the constant K. Assuming $x = \sphericalangle pu^*$, if x>K, then $x_{new}$ is represented in accordance with equation (28) provided below:

$$x_{new} = \frac{x}{\left(1 + \left|\frac{x}{K}\right|^\alpha\right)^{1/\alpha}}, \quad (28)$$

otherwise $x_{new}$ is represented in accordance with equation (29) provided below:

$$x_{new} = x \quad (29),$$

wherein α is a stiffness parameter.

FIG. 11 is an example graph 480 illustrating a phase curve 482 for the product term pu* over the frequency domain, in accordance with an embodiment. A vertical axis of the graph 480 represents phase angles expressed in degree units. A horizontal axis of the graph 480 represents frequency values in the frequency domain expressed in Hz units. The graph 480 further comprises a first horizontal line 481 representing the constant K, wherein K=89.5 degrees. As shown in FIG. 11, at about 93.72 Hz, a phase angle x (identified by reference numeral 482) for the product term pu* exceeds the constant K. The system 100 is configured to apply a function in accordance with equation (28) provided above to adjust the phase angle x to a new phase angle $x_{new}$ (identified by reference numeral 483) that does not exceed the constant K.

Figure 12:
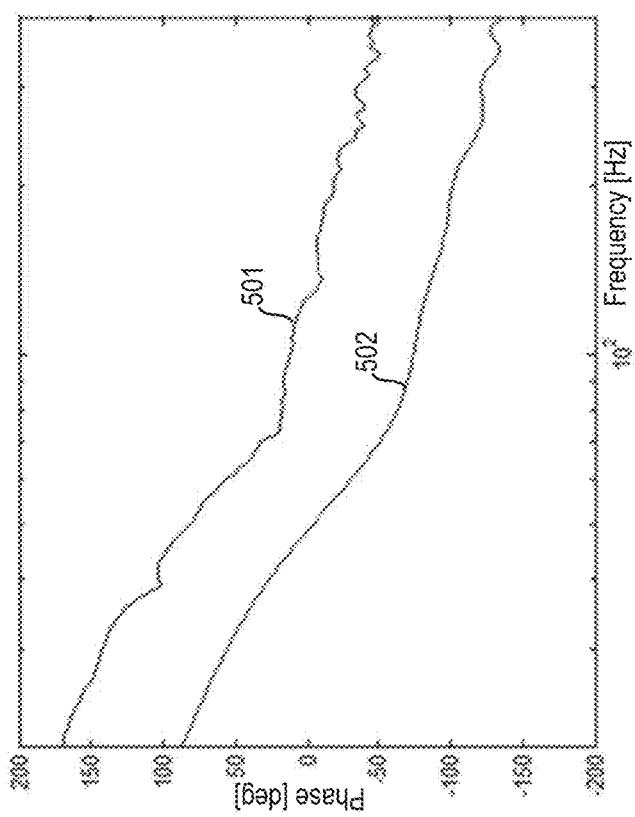
FIG. 12 is an example graph illustrating near-field sound pressure and complex conjugate of velocity of a diaphragm of a speaker driver, in accordance with an embodiment.

FIG. 12 is an example graph 500 illustrating the near-field sound pressure p and the complex conjugate u*, in accordance with an embodiment. A vertical axis of the graph 500 represents phase angles expressed in degree units. A horizontal axis of the graph 500 represents frequency values in the frequency domain expressed in Hz units. The graph 500 comprises: (1) a first curve 501 representing a phase curve for the near-field sound pressure p over the frequency domain, and (2) a second curve 502 representing a phase curve for the complex conjugate u* over the frequency domain.

Figure 13:
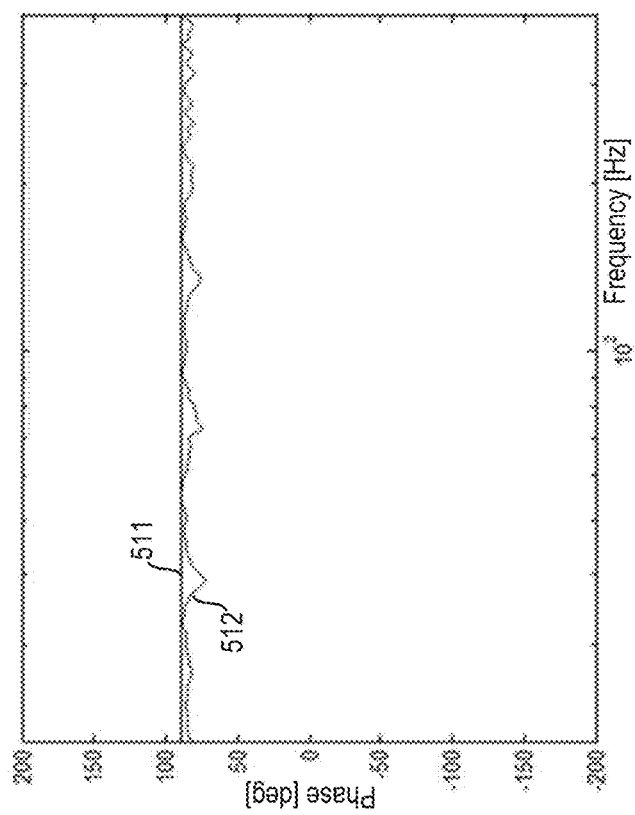
FIG. 13 is an example graph illustrating phase difference between near-field sound pressure and complex conjugate of velocity of a diaphragm of a speaker driver, in accordance with an embodiment.

FIG. 13 is an example graph 510 illustrating phase difference between the near-field sound pressure p and the complex conjugate u*, in accordance with an embodiment. A vertical axis of the graph 510 represents phase angles expressed in degree units. A horizontal axis of the graph 510 represents frequency values in the frequency domain expressed in Hz units. The graph 510 comprises: (1) a first horizontal line 511 representing a phase angle at 90 degrees, and (2) a curve 512 representing phase difference between the near-field sound pressure p and the complex conjugate u* over the frequency domain.

Unlike FIG. 7, phase difference between the near-field sound pressure p and the complex conjugate u* is relatively constant across frequencies.

In one embodiment, the sound power estimation unit 200 estimates the in-room total sound power output W using the complex conjugate u* and the near-field sound pressure p in accordance with equation (3) provided above. Let $W_{dB}$ denote an expression of the estimated in-room total sound power output W in dB units. In one embodiment, the sound power estimation unit 200 provides the estimated in-room total sound power output $W_{dB}$ in accordance with equation (30) provided below:

$$W_{dB} = 10 * \log_{10} \frac{W}{W_{ref}}, \qquad (30)$$

wherein $W_{ref}$ is a pre-determined target/desired sound power output.

Figure 14:
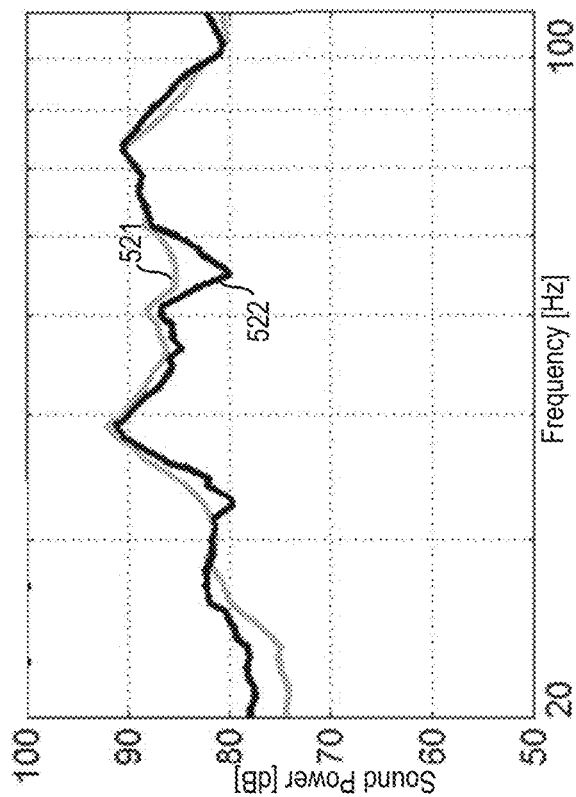
FIG. 14 is an example graph illustrating estimated in-room total sound power output and actual in-room total sound power output, in accordance with one embodiment.

FIG. 14 is an example graph 520 illustrating estimated in-room total sound power output and actual in-room total sound power output, in accordance with one embodiment. A vertical axis of the graph 520 represents sound power levels expressed in dB units. A horizontal axis of the graph 520 represents frequency values in the frequency domain expressed in Hz units. The graph 520 comprises each of the following curves: (1) a first curve 522 representing an estimated in-room total sound power output $W_{dB}$, and (2) a second curve 521 representing an actual in-room total sound power output (e.g., measured from about nine microphones placed at different locations of the room). As shown in FIG. 14, the curves 521 and 522 are substantially similar, with a slight deviation at around 25 Hz and 55 Hz.

In one embodiment, the system 100 is configured to equalize sound power output radiated from the loudspeaker device 100 to reduce/attenuate peaks related to room resonances and a position/location of the loudspeaker device 110. In one embodiment, the system 100 performs auto-equalization using a number of biquads constructing an IIR filter in front of the loudspeaker device 110 (e.g., the auto-EQ filter 160 in FIG. 1).

Figure 15:
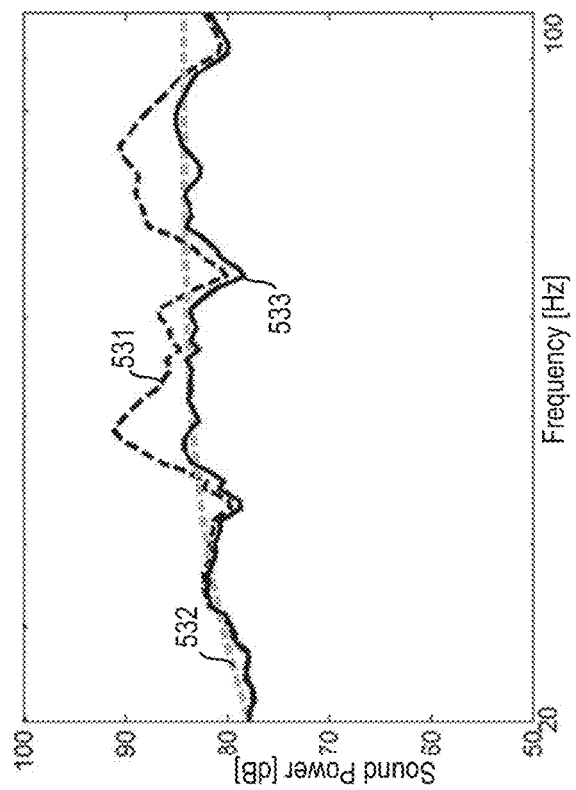
FIG. 15 is an example graph illustrating estimated in-room total sound power output, pre-determined target/desired sound power output, and equalized sound power output, in accordance with one embodiment.

FIG. 15 is an example graph 530 illustrating estimated in-room total sound power output, pre-determined target/desired sound power output, and equalized sound power output, in accordance with one embodiment. A vertical axis of the graph 530 represents sound power levels expressed in dB units. A horizontal axis of the graph 530 represents frequency values in the frequency domain expressed in Hz units. The graph 530 comprises each of the following curves: (1) a first curve 531 representing an estimated in-room total sound power output $W_{dB}$, (2) a second curve 532 representing a pre-determined target/desired sound power output, and (3) a third curve 533 representing equalized sound power output.

Figure 16:
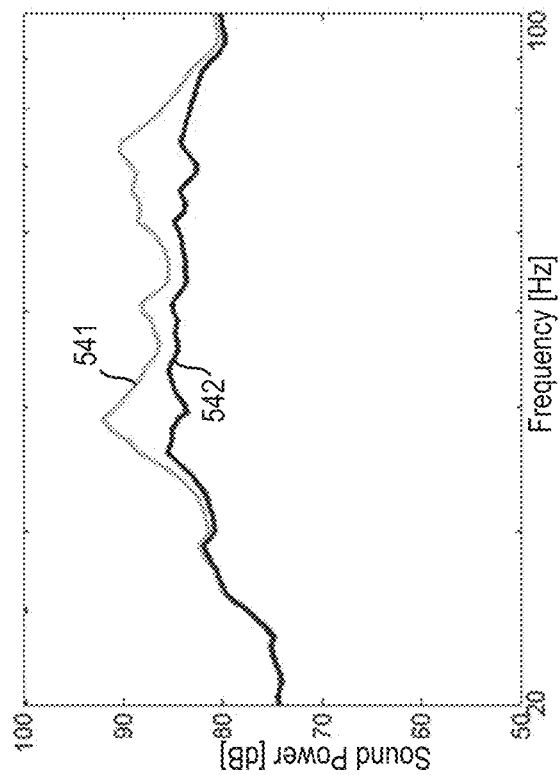
FIG. 16 is an example graph illustrating measured sound power output radiated from the loudspeaker device before and after auto-equalization, in accordance with one embodiment.

FIG. 16 is an example graph 540 illustrating measured sound power output radiated from the loudspeaker device 110 before and after auto-equalization, in accordance with one embodiment. A vertical axis of the graph 540 represents sound power levels expressed in dB units. A horizontal axis of the graph 540 represents frequency values in the frequency domain expressed in Hz units. The graph 550 comprises each of the following curves: (1) a first curve 541 representing measured sound power output radiated from the loudspeaker device 110 before auto-equalization (e.g., measured from about nine microphones placed at different locations of the room) and (2) a second curve 542 representing measured sound power output radiated from the loudspeaker device 110 after the auto-equalization (e.g., measured from about nine microphones placed at different locations of the room). As shown in FIG. 14, the curves 521 and 522 are substantially similar, with a slight deviation at around 25 Hz and 55 Hz.

As shown in FIGS. 15-16, as a result of auto-equalization (via the auto-EQ filter 160), prominent peaks related to room resonances and a position/location of the loudspeaker device 110 in the room are attenuated, resulting in the smoother curves 533 and 542. Auto-equalization yields a cleaner and tight bass reproduction in the room, thereby improving overall sound quality of the loudspeaker device 110.

In one embodiment, the system 100 is configured to: (1) either continually measure or periodically measure (e.g., once every hour) the near-field sound pressure p, and (2) automatically initiate and perform calibration of sound power output radiated from the loudspeaker device 100 in real-time based on a new measurement of the near-field sound pressure p.

In one embodiment, the system 100, via the sound power estimation unit 200, is configured to: (1) automatically detect one or more changes in acoustic conditions of the room (e.g., moving the loudspeaker device 110 from one position to another position in the room, changes resulting from one or more physical structures in the room, such as opening all doors, closing a room divider, opening a car window, air-conditioning turned on, etc.), and (2) automatically initiate and perform calibration of sound power output radiated from the loudspeaker device 100 in real-time with minimal user intervention based on the changes detected. In one embodiment, the system 100 is configured to automatically detect one or more changes in acoustic conditions of the room by: (1) reproducing, via the loudspeaker device 110, test signals or audio (e.g., music samples), and (2) receiving data indicative of measured sound power output radiated from the loudspeaker device 110 and associated with the test signals or audio reproduced.

In one embodiment, the system 100, via the sound power estimation unit 200, is configured to identify a position of the loudspeaker device 110 in the room based in part on detected acoustic conditions of the room. The system 100 is configured to optimize/enhance sound power output radiated from the loudspeaker device 110 based on the position identified. In one embodiment, the system 100 is able to identify a best position in the room to place the loudspeaker device 100 based in part on historical data (e.g., data indicative of different measured sound power outputs for different positions in the room that the loudspeaker device 100 may be positioned).

In one embodiment, the system 100 is configured to exchange data with an external electronic device (e.g., a smartphone, an audio receiver, a tablet, a remote control device, etc.) over a wired or wireless connection. The external electronic device may include one or more sensors, such a microphone. The external electronic device may be used to collect data (e.g., via its sensors), such as measured sound power output at particular listening position in the room, user input, etc. For example, the system 100 may use the collected data to optimize user listening experience at a particular listening position in the room (e.g., equalizing and weighting sound power output radiated from the loudspeaker device 100 towards the particular listening position).

FIG. 17 is an example flowchart of a process 900 for sound power optimization, in accordance with an embodiment. In process block 901, obtain a measurement of a near-field sound pressure of a speaker driver using a microphone. In process block 902, determine a velocity of a diaphragm of the speaker driver. In process block 903, automatically calibrate sound power levels of audio reproduced by the speaker driver based on the velocity and the measurement of the near-field sound pressure to automatically adjust the sound power levels to an acoustic environment of the speaker driver.

In one embodiment, one or more components of the system 100, such as the sound power estimation unit 200, is configured to perform process blocks 901-903.

Figure 18:
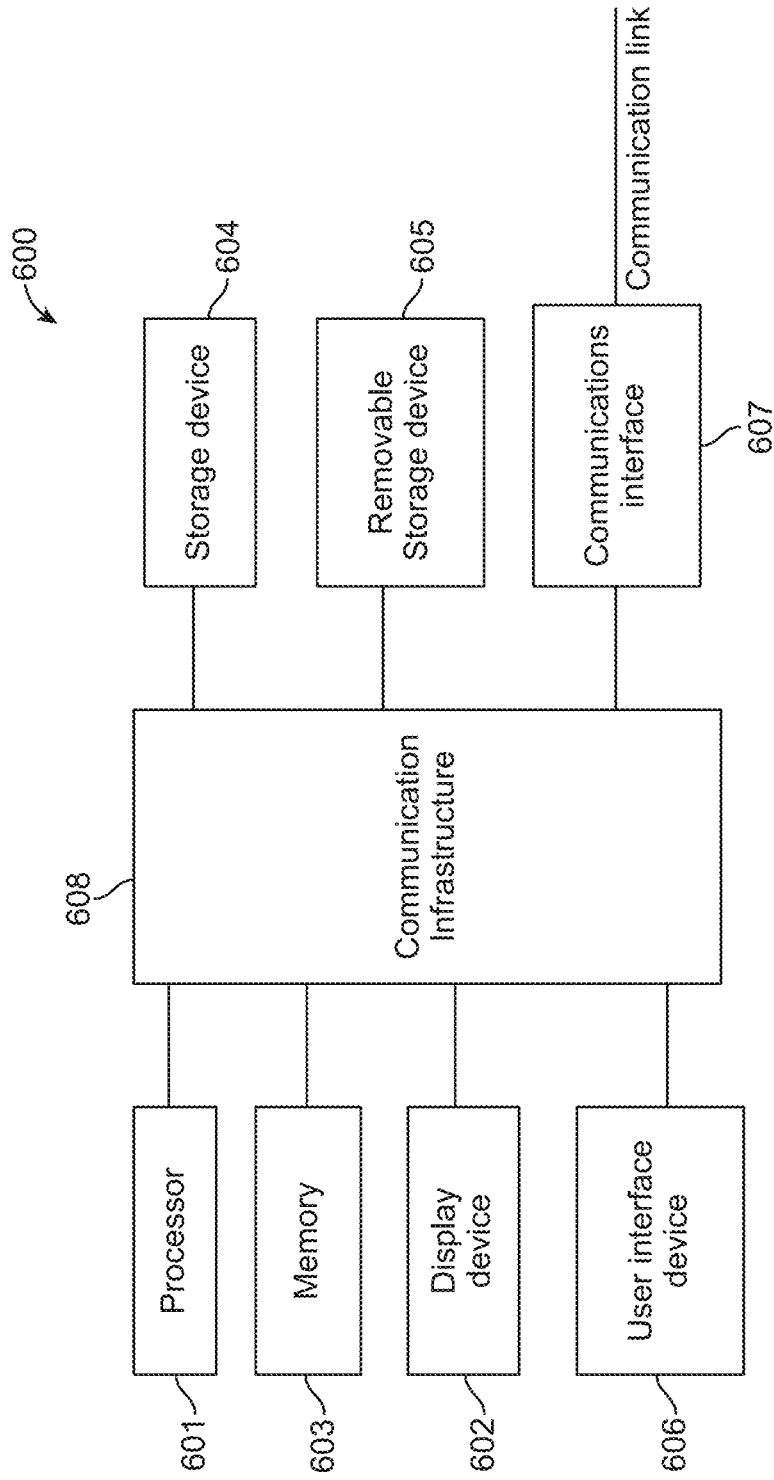
FIG. 18 is a high-level block diagram showing an information processing system comprising a computer system useful for implementing the disclosed embodiments.

FIG. 18 is a high-level block diagram showing an information processing system comprising a computer system 600 useful for implementing the disclosed embodiments. The computer system 600 includes one or more processors 601, and can further include an electronic display device 602 (for displaying video, graphics, text, and other data), a main memory 603 (e.g., random access memory (RAM)), storage device 604 (e.g., hard disk drive), removable storage device 605 (e.g., removable storage drive, removable memory module, a magnetic tape drive, optical disk drive, computer readable medium having stored therein computer software and/or data), user interface device 606 (e.g., keyboard, touch screen, keypad, pointing device), and a communication interface 607 (e.g., modem, a network interface (such as an Ethernet card), a communications port, or a PCMCIA slot and card). The main memory 603 may store instructions that when executed by the one or more processors 601 cause the one or more processors 601 to perform process blocks 901-903 of the process 900.

The communication interface 607 allows software and data to be transferred between the computer system and external devices. The system 600 further includes a communications infrastructure 608 (e.g., a communications bus, cross-over bar, or network) to which the aforementioned devices/modules 601 through 607 are connected.

Information transferred via communications interface 607 may be in the form of signals such as electronic, electromagnetic, optical, or other signals capable of being received by communications interface 607, via a communication link that carries signals and may be implemented using wire or cable, fiber optics, a phone line, a cellular phone link, an radio frequency (RF) link, and/or other communication channels. Computer program instructions representing the block diagram and/or flowcharts herein may be loaded onto a computer, programmable data processing apparatus, or processing devices to cause a series of operations performed thereon to produce a computer implemented process. In one embodiment, processing instructions for process 900 (FIG. 17) may be stored as program instructions on the memory 603, storage device 604 and the removable storage device 605 for execution by the processor 601.

Embodiments have been described with reference to flowchart illustrations and/or block diagrams of methods, apparatus (systems) and computer program products. Each block of such illustrations/diagrams, or combinations thereof, can be implemented by computer program instructions. The computer program instructions when provided to a processor produce a machine, such that the instructions, which execute via the processor create means for implementing the functions/operations specified in the flowchart and/or block diagram. Each block in the flowchart/block diagrams may represent a hardware and/or software module or logic. In alternative implementations, the functions noted in the blocks may occur out of the order noted in the figures, concurrently, etc.

The terms "computer program medium," "computer usable medium," "computer readable medium", and "computer program product," are used to generally refer to media such as main memory, secondary memory, removable storage drive, a hard disk installed in hard disk drive, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

As will be appreciated by one skilled in the art, aspects of the embodiments may be embodied as a system, method or computer program product. Accordingly, aspects of the embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the embodiments may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code for carrying out operations for aspects of one or more embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of one or more embodiments are described above with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the invention.

Though the embodiments have been described with reference to certain versions thereof; however, other versions are possible. Therefore, the spirit and scope of the appended claims should not be limited to the description of the preferred versions contained herein.

What is claimed is:

1. A device comprising:
   a speaker driver;
   a microphone configured to obtain a measurement of a near-field sound pressure of the speaker driver; and
   a controller configured to:
      receive data indicative of a current sensed through the speaker driver;
      determine a velocity of a diaphragm of the speaker driver based on the current sensed through the speaker driver;
      correct for a propagation delay between the microphone and the diaphragm; and
      automatically adjust sound power levels of audio reproduced by the speaker driver based on an acoustic environment of the device and a location of the device in the acoustic environment by automatically calibrating the sound power levels based on the velocity subsequent to correcting for the propagation delay and based on the measurement of the near-field sound pressure.

2. The device of claim 1, further comprising:
   a sensor connected to the speaker driver, wherein the sensor is configured to detect the current sensed through the speaker driver.

3. The device of claim 1, wherein the controller determines the velocity utilizing one of an accelerometer or a laser beam.

4. The device of claim 1, wherein the microphone is positioned as close as possible or attached to the diaphragm.

5. The device of claim 1, wherein the controller is further configured to:
   automatically detect a change in one or more acoustic conditions of the acoustic environment based on a set of measurements of the near-field sound pressure of the speaker driver.

6. The device of claim 5, wherein the set of measurements of the near-field sound pressure of the speaker driver is obtained on a periodic basis or a continuous basis.

7. The device of claim 5, wherein the controller is further configured to:
automatically adjust to the detected change by dynamically adjusting the sound power levels based on an updated velocity of the diaphragm and an updated measurement of the near-field sound pressure.

8. The device of claim 7, wherein the acoustic environment includes a room, and the detected change in the one or more acoustic conditions of the acoustic environment comprises one of: a change to a physical dimension or a layout of the room, a change to a physical structure in the room, or a change to the location of the device.

9. The device of claim 1, wherein the controller is further configured to:
correct for the propagation delay between the microphone and the diaphragm by adjusting a phase of the velocity to correct for a phase mismatch resulting from the propagation delay; and
estimate the sound power levels based on the adjusted phase of the velocity and the measurement of the near-field sound pressure.

10. The device of claim 1, wherein the controller is further configured to:
equalize the sound power levels to attenuate one or more peaks in sound distribution of the device, wherein the one or more peaks are associated with resonances in the acoustic environment.

11. The device of claim 10, wherein the controller is further configured to:
receive information indicative of a listening position in the acoustic environment from an external device, wherein the sound power levels are equalized based on the information.

12. The device of claim 11, wherein the controller is further configured to:
automatically determine a position of the device in the acoustic environment based on the measurement of the near-field sound pressure of the speaker driver, wherein the sound power levels are optimized based on the position of the device.

13. The device of claim 1, wherein the controller is further configured to:
automatically determine a best position in the acoustic environment that the device should be positioned in based on different measurements of the near-field sound pressure of the speaker driver, wherein the different measurements are obtained at different positions in the acoustic environment.

14. The device of claim 1, wherein the controller is further configured to:
identify a total Q factor and a resonant frequency for the device using system identification in the frequency domain or in the time domain based on input voltage to terminals of the speaker driver and the measurement of the near-field sound pressure.

15. A method comprising:
obtaining a measurement of a near-field sound pressure of a speaker driver using a microphone;
receiving data indicative of a current sensed through the speaker driver;
determining a velocity of a diaphragm of the speaker driver based on the current sensed through the speaker driver;
correcting for a propagation delay between the microphone and the diaphragm; and
automatically adjusting sound power levels of audio reproduced by the speaker driver based on an acoustic environment of the speaker driver and a location of the speaker driver in the acoustic environment by automatically calibrating the sound power levels based on the velocity subsequent to correcting for the propagation delay and based on the measurement of the near-field sound pressure.

16. The method of claim 15, further comprising:
detecting the current sensed through the speaker driver using a sensor connected to the speaker driver.

17. The method of claim 15, further comprising:
automatically detect a change in one or more acoustic conditions of the acoustic environment based on a set of measurements of the near-field sound pressure of the speaker driver, wherein the set of measurements of the near-field sound pressure of the speaker driver is obtained on a periodic basis or a continuous basis; and
automatically adjust to the detected change by dynamically adjusting the sound power levels based on an updated velocity of the diaphragm and an updated measurement of the near-field sound pressure.

18. The method of claim 15, further comprising:
correcting for the propagation delay between the microphone and the diaphragm by adjusting a phase of the velocity to correct for a phase mismatch resulting from the propagation delay; and
estimating the sound power levels based on the adjusted phase of the velocity and the measurement of the near-field sound pressure.

19. The method of claim 15, further comprising:
equalizing the sound power levels to attenuate one or more peaks in sound distribution of the speaker driver, wherein the one or more peaks are associated with resonances in the acoustic environment.

20. A non-transitory computer readable storage medium including instructions to perform a method comprising:
obtaining a measurement of a near-field sound pressure of a speaker driver using a microphone;
receiving data indicative of a current sensed through the speaker driver;
determining a velocity of a diaphragm of the speaker driver based on the current sensed through the speaker driver;
correcting for a propagation delay between the microphone and the diaphragm; and
automatically adjusting sound power levels of audio reproduced by the speaker driver based on an acoustic environment of the speaker driver and a location of the speaker driver in the acoustic environment by automatically calibrating the sound power levels based on the velocity subsequent to correcting for the propagation delay and based on the measurement of the near-field sound pressure.

* * * * *